United States Patent [19]

Choi

[11] Patent Number: 6,087,839
[45] Date of Patent: Jul. 11, 2000

[54] APPARATUS FOR TESTING PRINTED CIRCUIT BOARD

[75] Inventor: Kyoung-Shik Choi, Suwon, Rep. of Korea

[73] Assignee: SamSung Electronics Co., Ltd., Kyungki-do, Rep. of Korea

[21] Appl. No.: 09/042,042

[22] Filed: Mar. 13, 1998

[30] Foreign Application Priority Data

Mar. 13, 1997 [KR] Rep. of Korea ......................... 97-8428

[51] Int. Cl.⁷ .................................................. G01R 31/02
[52] U.S. Cl. ........................................... 324/754; 324/761
[58] Field of Search .................................... 324/754, 757, 324/540, 531, 546, 73.1, 158.1, 761, 762; 714/724, 738; 434/482, 824

[56] References Cited

U.S. PATENT DOCUMENTS

| | | | |
|---|---|---|---|
| 5,029,166 | 7/1991 | Jarwala et al. | 714/724 |
| 5,029,274 | 7/1991 | Goff et al. | 324/540 |
| 5,285,152 | 2/1994 | Hunter | 324/73.1 |
| 5,504,432 | 4/1996 | Chandler et al. | |
| 5,557,209 | 9/1996 | Crook et al. | |
| 5,621,741 | 4/1997 | Kohiyama | |
| 5,656,646 | 8/1997 | Kit | |
| 5,689,191 | 11/1997 | Kashiyama | |

Primary Examiner—Vinh P. Nguyen
Attorney, Agent, or Firm—Robert E. Bushnell, Esq.

[57] ABSTRACT

An in-circuit test machine testing a printed circuit board (PCB). The test machine is placed in contact with soldered terminals of circuit components mounted on the printed circuit board and measures values of parameters of the respective circuit components. The measured values are compared with reference values stored in a data storage unit in the test machine. According to the result of the comparison, it is determined whether the circuit components are defective or not defective. The apparatus includes a connector tester testing terminals of a connector mounted on the printed circuit board in order to determine whether the terminals are defective or not defective. The terminals of the tested connector include terminals for data signal input and output, control signal input and output, and power input and output.

26 Claims, 3 Drawing Sheets

APPARATUS FOR TESTING PRINTED CIRCUIT BOARD

CLAIM OF PRIORITY

This application makes reference to, incorporates the same herein, and claims all benefits accruing under 35 U.S.C. § 119 from an application for IN-CIRCUIT TEST MACHINE earlier filed in the Korean Industrial Property Office on the 13th day of March 1997, and there duly assigned Ser. No. 97-8428, a copy of which is annexed hereto.

BACKGROUND OF THE INVENTION

1. Technical Field

The present invention relates to an in-circuit test machine and, more particularly, to an in-circuit test machine testing circuit components soldered on a printed circuit board (PCB), further capable of testing connectors soldered on the printed circuit board and the soldering state of the connectors on the printed circuit board.

2. Related Art

Typically, when a large quantity of printed circuit boards are produced, an operator separates defective printed circuit boards from printed circuit boards that are not defective by manually bringing an in-circuit tester into contact with connecting terminals of respective circuit components soldered on the printed circuit board.

As a result of the manual intervention of the operator, a great amount of time is required for the test. And sometimes not all printed circuit boards are tested. Accordingly, a defective printed circuit board including defective circuit components may be included in products. When it is determined that a defective printed circuit board causes product defects in one of the final steps of a fabricating process, the product must be exploded and the defective printed circuit board must be replaced with a printed circuit board that is not defective. This results in a reduced fabricating efficiency, a waste of resources, and an increased cost.

Methods have been developed to automatically test circuit components on all printed circuit boards, as opposed to just some printed circuit boards. The testing occurs before the printed circuit boards are assembled as products. A printed circuit board to be tested is transferred to a predetermined position of a tester. A testing terminal of the tester is brought into contact with connecting terminals of respective components mounted on the printed circuit board to measure a testing value of a parameter. The testing value is compared with a reference value saved in a data storage unit of the tester. According to the result of the comparison, it is determined whether the is circuit components of the printed circuit board are defective or not.

However, a printed circuit board tester adapting such a method as described above cannot test connectors soldered on the printed circuit board. In general, a connector inputting and outputting power and data has two terminals. The first terminal is soldered on the printed circuit board. The second terminal is designed to receive another printed circuit board, a cable, a connector, or other device. The second terminal generally is not connected to anything at the time the printed circuit board is being tested. Accordingly, even though signals testing the connector are supplied through the first terminal (that is, the soldered terminal) of the connector by bringing a testing terminal of the tester into contact with the first terminal, the result signals are not outputted because the second terminal of the connector is not connected to anything and the connector is in an open circuit. Since the connector is in an open, it is impossible to determine whether the connector is defective or not defective.

Methods and devices have been developed to test printed circuit boards, connectors, and integrated circuits, as disclosed in U.S. Pat. No. 5,504,432 for system and method for detecting short, opens and connected pins on a printed circuit board using automatic test equipment issued to Chandler et al., U.S. Pat. No. 5,557,209 for identification of pin-open faults by capacitive coupling through the integrated circuit package issued to Crook et al., U.S. Pat. No. 5,621,741 for method and apparatus for testing terminal connections of semiconductor integrated circuits issued to Kohiyama, U.S. Pat. No. 5,656,646 for apparatus for testing printed circuit boards issued to Kit, and U.S. Pat. No. 5,689,191 for terminal in-connector checking device issued to Kashiyama.

Although presently there do exist methods and devices testing printed circuit boards, I have discovered that it would be desirable to improve an in-circuit test machine in order to test connectors and components of printed circuit boards more completely and efficiently.

SUMMARY OF THE INVENTION

Accordingly, it is therefore an object of the present invention to provide an in-circuit test machine testing circuit components as well as connectors soldered on a printed circuit board.

According to the principles of the present invention, values of parameters of circuit components mounted on a printed circuit board are measured by bringing an in-circuit testing machine into contact with soldered terminals of the circuit components. The measured parameters can include voltage, current, resistance, capacitance, and other parameters. Then the measured values of the parameters of the circuit components are compared with reference values of the respective circuit components saved in a data storage unit of the in-circuit testing machine. According to the result of the comparison, it is determined whether the circuit components are defective or not defective. At the same time, it is possible to test respective terminals of connectors inputting and outputting data or power mounted on the printed circuit board using a connector tester included in the in-circuit testing machine.

An embodiment of the connector tester according to the principles of the present invention includes a connector being detachably and electrically connected to a connector soldered on the printed circuit board, and a closed circuit unit that is electrically connected via cable to the connector being detachably and electrically connected to the connector soldered on the printed circuit board.

Another embodiment of the connector tester according to the principles of the present invention includes a first connector being detachably and electrically connected to a connector soldered on the printed circuit board, a second connector that is connected to the first connector via a cable, a third connector being detachably and electrically connected to the second connector, and a closed circuit unit that is connected to the third connector.

Preferably, the closed circuit unit includes a common terminal corresponding to respective terminals of the connector soldered on the printed circuit board, and a plurality of terminals connected to the common terminal through respectively predetermined components. The predetermined components maybe diodes. Preferably, the plurality of terminals maybe respectively connected to anodes of the diodes and the common terminal may be connected to cathodes of the diodes. In addition, the cable may be a flat cable.

The present invention is more specifically described in the following paragraphs by reference to the drawings attached only by way of example.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings in which like reference symbols indicate the same or similar components, wherein.

DETAILED DESCRIPTION OF THE PREFERRED EMBODIMENTS

Figure 1:
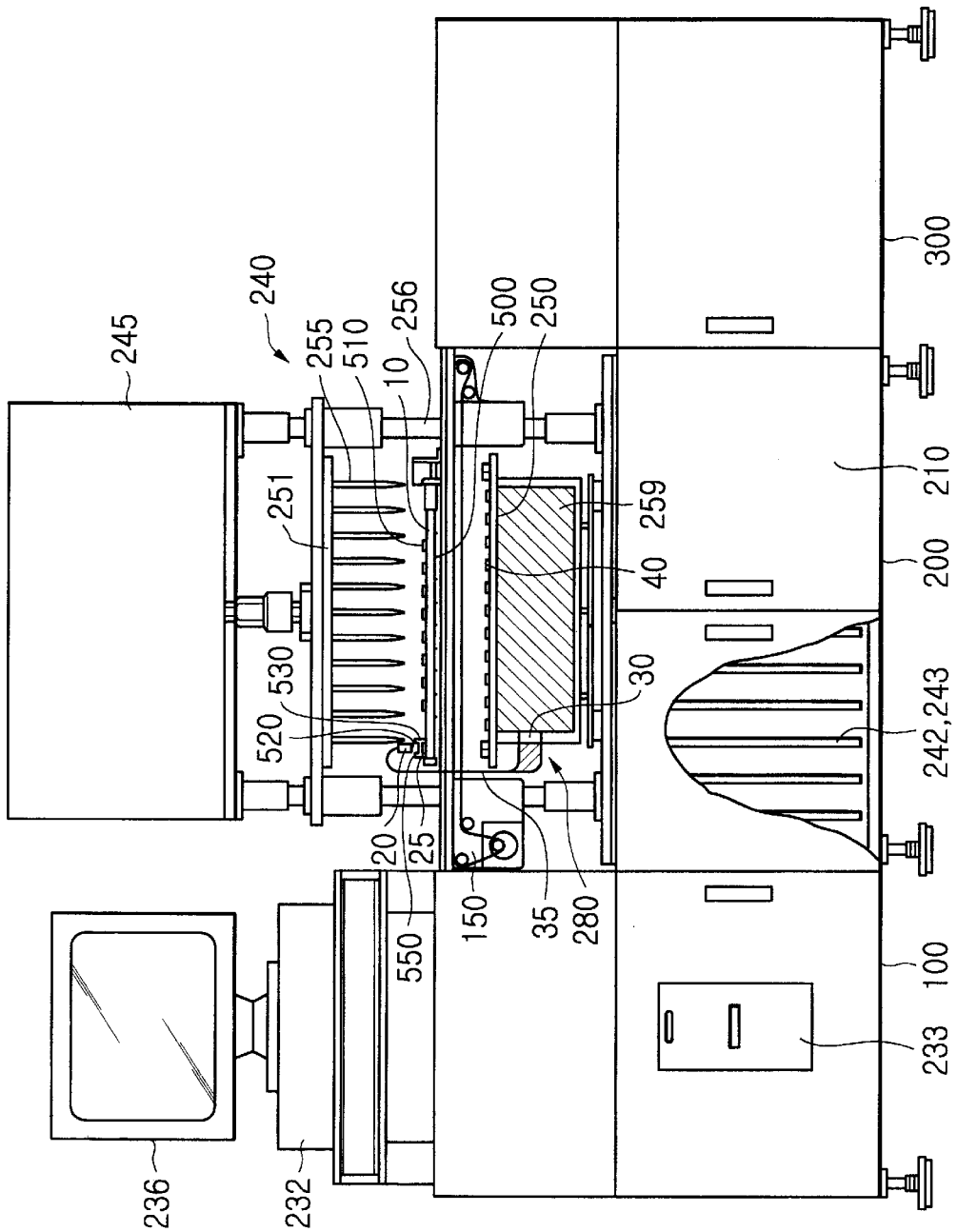
FIG. 1 is a schematic diagram illustrating an in-circuit test machine testing a printed circuit board according to the principles of the present invention.

Refer now to FIG. 1, which is a schematic diagram illustrating an in-circuit test machine testing a printed circuit board 10 according to the principles of the present invention. As shown in FIG. 1, the in-circuit test machine includes a loading portion 100 receiving from a previous process a printed circuit board 10 to be tested and loading the printed circuit board 10 on a test position. There is a testing portion 200 determining whether circuit components 510 on the printed circuit board 10 transferred from the loading portion 100 are defective or not defective by bringing a testing terminal 40 into contact with connecting terminals 500 of the circuit components 510. There is an unloading portion 300 unloading the printed circuit board 10 and transferring the printed circuit board 10 to a subsequent process.

Figure 2:
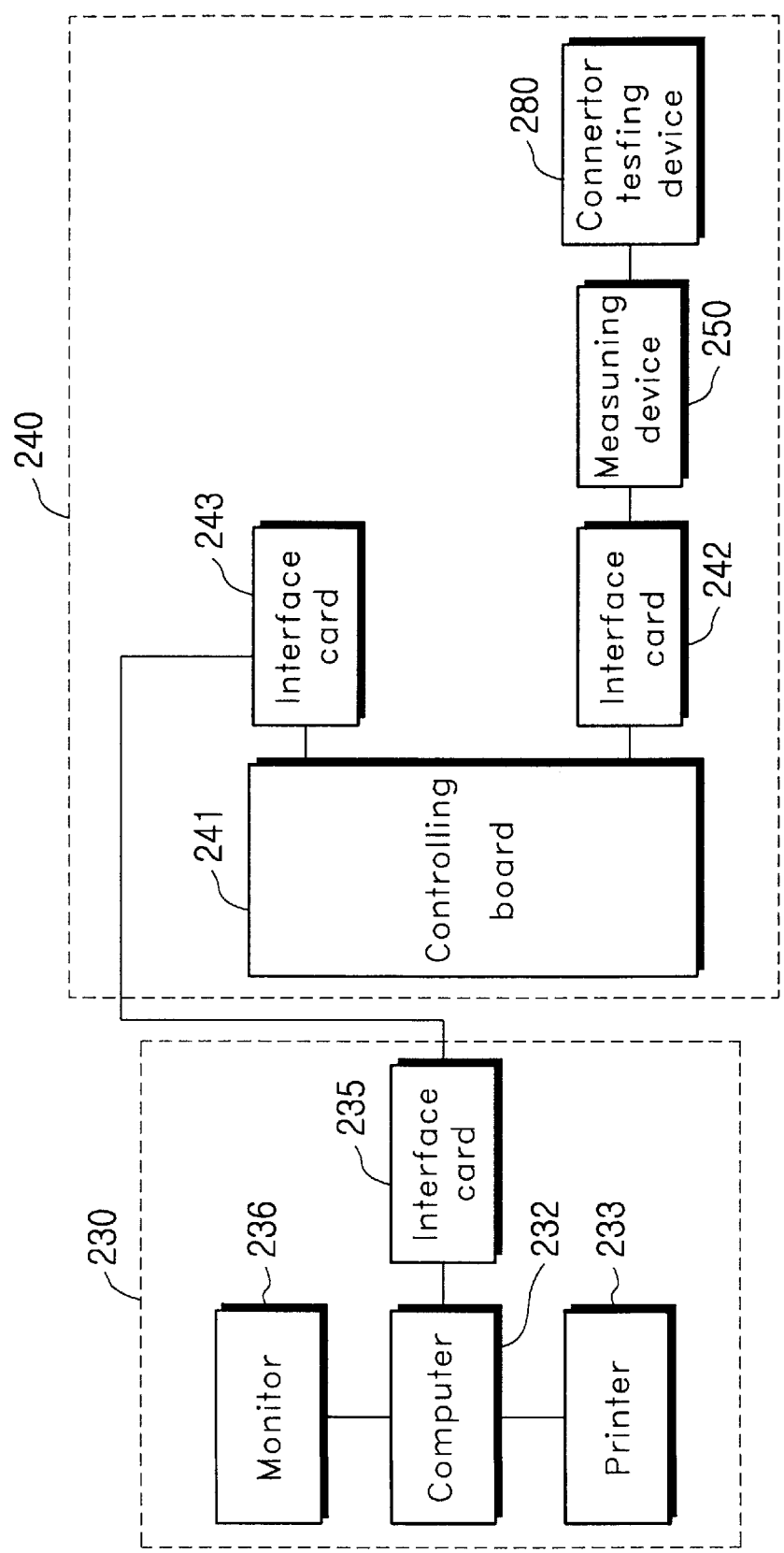
FIG. 2 is a block diagram illustrating an in-circuit test machine testing a printed circuit board, according to the principles of the present invention.

With continued reference to FIG. 1, refer now to FIG. 2, which is a block diagram illustrating an in-circuit test machine testing a printed circuit board, according to the principles of the present invention. The loading portion 100 is composed of a controlling portion 230 and a printed circuit board transferring apparatus (not shown). The controlling portion 230 includes a computer 232 which stores reference values and information related to connection patterns of all circuit components mounted on a printed circuit board, and, in addition, stores all results of the testing performed on the printed circuit boards. Such values and results can be stored in a memory of the computer 232. A monitor 236 is connected to the computer 232. Interface cards 235 are installed in the computer 232. Also, there is a printer 233. The interface cards 235 exchange predetermined data between the computer 232 and a measuring portion 240 that will be described later. The printer 233 prints the results of the tests performed on the printed circuit board.

The testing portion 200 includes a transferring apparatus 150 and the measuring portion 240 that exchanges data with the computer 232 by the interface card 235. The transferring apparatus 150 of the testing portion 200 receives the printed circuit board 10 from a transferring apparatus of the loading portion 100. The transferring apparatus 150 transfers the printed circuit board 10 to a test position. The measuring portion 240 determines whether the circuit components 510 on the transferred printed circuit board 10 are defective or not.

The measuring portion 240 includes a controlling board 241 and a measuring device 250. The controlling board 241 receives measured values of parameters from respective connecting terminals 500 of the circuit components 510 on the printed circuit board 10. The controlling board 241 determines capacitances of the components 510, insertion state of the components 510 into the printed circuit board 10, and other information. The measuring device 250 is operated by the controlling board 241 through interface cards 242 and 243.

In FIG. 1, a cabinet 210 is installed under loading portion 200. In the cabinet 210, the controlling board 241 is installed. The interface cards 242 and 243 are inserted into slots in the controlling board 241. Four shafts 256 are fixed to the top surface of the cabinet 210. A cabinet 245 including therein a cylinder is installed at an upper end of each of the shafts 256. In addition, the transferring portion 150 including a conveyor belt is movably installed on the shafts 256. A press 251 is connected to the cylinder above the transferring portion 150 in such a manner that the press 251 can be vertically moved up and down loaded on the shafts 256. A plurality of pressing pins 255 pressing the printed circuit board 10 are fixed at the bottom of the press 251.

A measuring device 250 is installed under the transferring portion 150. When the printed circuit board 10 is pushed down by the press 251, the terminals 500 of the circuit components 510 in the printed circuit board 10 come into contact with the measuring device 250. The measuring device 250 includes thereon a plurality of measuring terminals 40 at respective positions corresponding to the terminals 500 of the circuit components 510 mounted on the printed circuit board 10. A connector tester 280 testing a connector 25 mounted on the printed circuit board 10 is installed on the measuring device 250. The electronic components 510 on the printed circuit board 10 are tested to determine whether the capacities of the respective components 510 mounted on the printed circuit board 10 are appropriate or not, and to determine whether the connection states of the circuit components 510 of the printed circuit board 10 are appropriate or not. Voltage is applied to the printed circuit board 10 through the measuring terminals 40. This voltage applied can be considered at test signal.

Figure 3:
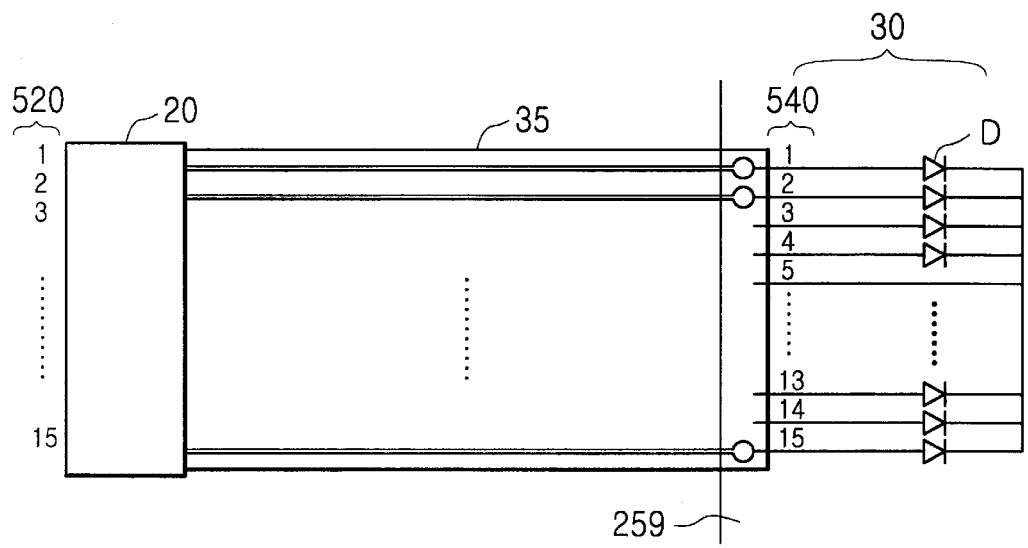
FIG. 3 is a schematic diagram illustrating an embodiment of a connector tester testing connectors, according to the principles of the present invention.

Refer now to FIG. 3, which is a schematic diagram illustrating an embodiment of a connector tester testing connectors, according to the principles of the present invention. In FIG. 3, a connector tester 280 is illustrated. The printed circuit board 10 can be any printed circuit board. For the purpose of this discussion, FIG. 3 shall be discussed presuming the printed circuit board 10 used in the in-circuit test machine is a board for use in a monitor. Also for the purpose of this discussion, it shall be presumed that the connector 25 mounted on the printed circuit board 10 is a D-SUB type monitor signal connector having 15 pins 530. The D-SUB type monitor signal connector transmits and receives video signals between a computer and the monitor.

With reference to FIGS. 1 and 3, the connector tester 280 includes a connector 20. The printed circuit board 10 includes a connector 25 soldered on the printed circuit board 10. In order to test the connector 25, the connector 20 is connected to the connector 25. The connector 20 is connected to connector 25 by placing connector 20 into the connection slot 550 of connector 25, as shown in FIG. 1. A closed circuit unit 30 is electrically connected to the connector 20 via a cable 35. Preferably, the cable 35 is a flat cable.

As shown in FIG. 3, the connector 20 includes 15 pins 520 corresponding to the 15 pins 530 of the connector 25 mounted on the printed circuit board 10. The closed circuit unit 30 includes terminals 540 and uses a fifth pin as a common terminal. The fifth pin is one of the terminals 540. The other pins 540 of the closed circuit unit 30 are connected to the fifth pin, i.e., the common terminal, via diodes D in such a manner that terminals outputted from the connector 20 are connected to anodes + of the diodes D and the fifth terminal is connected to the cathodes – of the diodes D. In FIG. 3, the closed circuit unit 30 is formed on a board 259 installed in the measuring device 250. An end of the cable 35 is soldered on the board 259. As a result, the connector tester 280 is always replaced or moved together with the measuring device 250 as a single body.

Figure 4:
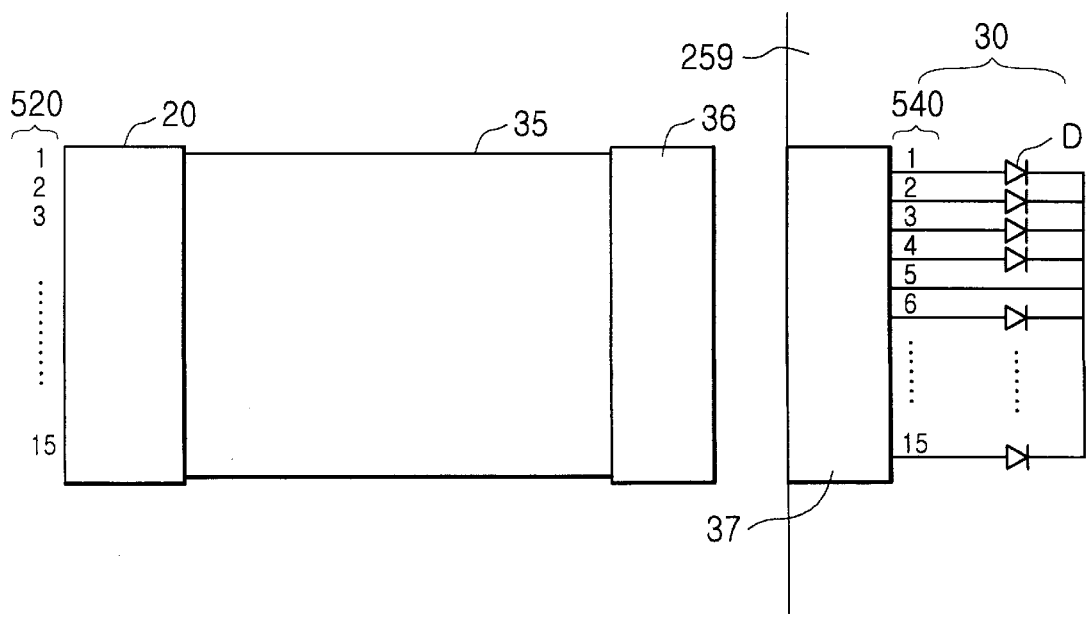
FIG. 4 is a schematic diagram illustrating another embodiment of a connector tester testing connectors, according to the principles of the present invention.

Refer now to FIG. 4, which is a schematic diagram illustrating another embodiment of a connector tester testing connectors, according to the principles of the present invention. In FIG. 4, the connector tester 280 includes a first connector 20 being detachably and electrically connected to a connector 25 soldered on the printed circuit board 10, a second connector 36 that is connected to the first connector 20 via a cable 35, a third connector 37 being detachably and electrically connected to the second connector 36, and a closed circuit unit 30 that is connected to the third connector 37. The closed circuit unit includes terminals 540. Accordingly, the second connector 36 can be electrically connected to or cut off by attaching or detaching the second connector 36 to or from the third connector 37. This results in an easy replacement of the measuring device 250.

In FIG. 1, the unloading portion 300 may include a diverter (not shown) transferring printed circuit boards that have been tested to a subsequent process, depending on the results of the testing. After the testing has been performed, the unloading portion 300 separates the tested boards into one area for defective printed circuit boards and a second area for printed circuit boards which are not defective. The unloading portion 300 has a storing portion (not shown) storing the defective printed circuit boards.

The operation of the in-circuit test machine testing printed circuit boards according to the principles of the present invention will be described hereinafter. As shown in FIG. 1, a printed circuit board 10 on which circuit components 510 have been completely mounted through a previous process is introduced into the loading portion 100. The loading portion 100 then checks whether any other printed circuit board is tested in the testing portion 200 or not. If any other printed circuit board is tested in the testing portion 200, the printed circuit board 10 remains in the loading portion 100. After the printed circuit board in the test portion 200 is completely tested and transferred to the unloading portion 300, the printed circuit board 10 located in the loading portion 100 is transferred to the testing portion 200 in such a manner that the conveyor belt of the transferring portion 150 is operated and stopped when the printed circuit board 10 arrives at a predetermined position between the press 251 and the measuring device 250.

Thereafter, a pneumatic cylinder in the cylinder cabinet 245 is operated so that the transferring portion 150 including the printed circuit board 10 is moved along a shaft 256 toward the measuring device 250. When the transferring portion 150 has been completely moved, soldered terminals 500 of the circuit components 510 formed on a bottom surface of the printed circuit board 10 come into contact with the measuring terminals 40 formed on a top surface of the measuring device 250.

However, the printed circuit board 10 cannot completely contact the measuring terminals 40 under this condition. Then the press 251 is vertically moved down to press the printed circuit board 10 according to the operation of the pneumatic cylinder. Thus, the pressing pins 255 fixed onto the bottom surface of the press 251 are caused to press the printed circuit board 10. As a result, the soldered terminals 500 of the circuit components 510 formed on the bottom surface of the printed circuit board 10 come into complete contact with the measuring terminals 40 of the measuring device 250. The pressing pins 255 are formed spaced apart from each other such that the pressing pins 255 do not come into contact with the circuit components 510 when the pressing pins 255 are moved down and press the printed circuit board 10.

The printed circuit board 10 is connected to the connector tester 280 by an operator. When the connector tester embodiment shown in FIG. 3 is used, the connector 20 is inserted into the connector 25 mounted on the printed circuit board 10. When the connector tester embodiment shown in FIG. 4 is used, the connector 20 is inserted into the connector 25 mounted on the printed circuit board 10, and the connector 36 is inserted into the connector 37. Then the connector 25 is completely prepared to be tested.

Thereafter, the in-circuit test machine is set to a particular operational mode, according to the type of circuit components 510 to be tested. The operational mode might be a resistance measuring mode, a condenser measuring mode, a diode measuring mode, or other modes. Isolation tests, continuity tests, functionality tests, and other types of tests can be performed on the printed circuit board 10 by the measuring device 250.

Under the condition that the test machine is set in a short and open mode, reference values of parameters of the respective circuit components 510 mounted on the printed circuit board 10 are generated using the measuring terminals 40 formed on the measuring device 250.

Thereafter data are input based on the generated reference values. The input data can include predetermined data such as an upper limit value, a lower limit value, and other values. The data are used to identify defective circuit components and those which are not defective. Using the data, the circuit components 510 mounted on the printed circuit board 10 are tested. The testing can involve a test signal being applied to some of the circuit components 510. The defective circuit components are identified as well as the circuit components that are not defective. After identifying the defective circuit components and the circuit components that are not defective, the results are output to the monitor 236 or the printer 233. If it is determined that the circuit components are not defective, the test process is terminated.

Otherwise, if it is determined that any of the circuit components are defective, the operator removes the causes of the defects of the circuit component through a debugging process. Then, the other circuit components are tested in the same manner until all the circuit components on the printed circuit board 10 are completely tested and repaired if necessary.

The operation of the connector tester 280 will be described hereinafter. First, the connector tester 280 is connected to the connector 25 on the printed circuit board 10. After the connector tester 280 is connected to the connector 25, a test signal can be applied to one or more of the terminals 530 located within the connector 25. Values of the parameters of respective terminals 530 of the connector 25 are successively measured. In other words, voltage values at electrodes corresponding to the ends of the diodes D of the connector tester 280 are successively measured. The voltage values are compared with reference values of the voltages of respective terminals 530 of the connector 25, whereby it can be determined whether the connector 25 is defective or not defective. The reference values means the cut-off voltages on the ends of the diodes D, 0.7 volts. The tester 280 determines whether the terminals 530 of the connector 25 are defective or not defective, according to the upper limit values and the lower limit values of the voltages of respective components with respect to the measured voltage values. Testing of the connector 25 verifies the correct placement of pins 530 in the connector 25 and also verifies the integrity of the soldered connections between the pins 530 in the connector 25 and the circuit patterns on the printed circuit board 10.

After being completely tested according to the aforementioned steps, the printed circuit board 10 is separated from the connector tester 280 and transferred to a subsequent process. Then, a new printed circuit board is tested in the test position of the testing portion 200 in the same manner.

As mentioned above, the in-circuit test machine according to the principles of the present invention is capable of testing connectors soldered on the printed circuit board by connecting the closed circuit unit to the connector soldered on the printed circuit board. The monitor 236 show in FIG. 1 can correspond to a liquid crystal display, a cathode ray tube, a field emission display, a plurality of electro-luminescent panels, a gas-plasma screen, a plurality of light-emitting diode panels, or other video display unit. The monitor 236 displays results of testing, in addition to other information.

While there have been illustrated and described what are considered to be preferred embodiments of the present invention, it will be understood by those skilled in the art that various changes and modifications may be made, and equivalents may be substituted for elements thereof without departing from the true scope of the present invention. In addition, many modifications may be made to adapt a particular situation to the teaching of the present invention without departing from the central scope thereof. Therefore, it is intended that the present invention not be limited to the particular embodiment disclosed as the best mode contemplated to carry out the present invention, but that the present invention includes all embodiments falling within the scope of the appended claims.

What is claimed is:

1. A testing apparatus testing a printed circuit board, comprising:

a test unit having a first plurality of terminals;

a first connector unit having a second plurality of terminals connected to a printed circuit board, said second plurality of terminals being detachably electrically connected to said first plurality of terminals of said test unit;

said test unit transmitting a verification signal to at least one of said second plurality of terminals of said first connector unit, said test unit measuring voltages at at least one of said first plurality of terminals, said test unit comparing the measured voltages with reference values;

said test unit detecting correct placement of said second plurality of terminals in response to said comparing of the measured voltages with the reference values; and said test unit detecting integrity of a plurality of electrical connections between said second plurality of terminals and the printed circuit board in response to said comparing of the measured voltages with the reference values.

2. The apparatus of claim 1, said test unit further comprising a second connector unit, said test unit being connected to said first connector unit when said second connector unit is coupled with said first connector unit.

3. The apparatus of claim 2, said first connector unit further comprising:

a body having a first side and a second side, the first side having a connection slot receiving said second connector unit; and said second plurality of terminals passing through the second side of said body, connecting said first connector unit to the printed circuit board, and detachably connecting said first connector unit to said second connector unit.

4. The apparatus of claim 3, said test unit further comprising:

a test connector unit having said first plurality of terminals detachably connected to said second plurality of terminals of said first connector unit, said test connector unit performing said measuring of the voltages; and a cable electrically connecting said test connector unit with said second connector unit, conveying said verification signal to said at least one of said second plurality of terminals of said first connector unit.

5. The apparatus of claim 4, said first plurality of terminals of said test connector unit further comprising:

a reference terminal; and a plurality of electrical connections each being connected to said reference terminal and each being coupled to one respective electrical element of a plurality of electrical elements.

6. The apparatus of claim 5, said plurality of electrical elements corresponding to a plurality of diodes.

7. The apparatus of claim 4, said first plurality of terminals of said test connector unit further comprising:

a reference terminal; and a plurality of electrical connections each being connected to said reference terminal and each being coupled to one respective electrical element selected from a plurality of electrical elements, said plurality of electrical elements corresponding to a plurality of diodes.

8. The apparatus of claim 7, further comprising:

a video display unit conveying varying visual information, said display unit being selected from the group consisting of a liquid crystal display, a cathode ray tube, a field emission display, a plurality of electro-luminescent panels, a gas-plasma screen, and a plurality of light-emitting diode panels.

9. The apparatus of claim 1, further comprising:

a measuring unit being detachably connected to the printed circuit board;

a plurality of circuit components being mounted on the printed circuit board; and said measuring unit applying test signals to at least one of the plurality of circuit components of the printed circuit board, measuring response signals in response to said test signals, identifying defects in the plurality of circuit components according to said response signals, identifying defects in connections among the plurality of circuit components according to said response signals, storing data corresponding to said response signals.

10. The apparatus of claim 9, further comprising:

said measuring unit having a third plurality of terminals;

the printed circuit board having a fourth plurality of terminals coupled to the plurality of circuit components;

said third plurality of terminals of said measuring unit being detachably connected to the fourth plurality of terminals of the printed circuit board; and said measuring unit applying said test signals to the fourth plurality of terminals through said third plurality of terminals.

11. The apparatus of claim 1, said test unit further comprising:

a test connector unit having said first plurality of terminals detachably connected to said second plurality of terminals of said first connector unit, said test connector unit performing said measuring of the voltages; and a cable electrically connecting said test connector unit with said first connector unit, conveying said verification signal to said at least one of said second plurality of terminals of said first connector unit.

12. The apparatus of claim 3, further comprising:

a measuring unit being detachably connected to the printed circuit board;

a plurality of circuit components being mounted on the printed circuit board; and said measuring unit applying test signals to at least one of the plurality of circuit components of the printed circuit board, measuring response signals in response to said test signals, storing data corresponding to said response signals.

13. A testing apparatus testing a printed circuit board, comprising:

a test unit having a first plurality of terminals;

a first connector unit having a second plurality of terminals connected to a printed circuit board, said second plurality of terminals being detachably electrically connected to said first plurality of terminals of said test unit;

said test unit transmitting a verification signal to at least one of said second plurality of terminals of said first connector unit, said test unit measuring voltages at at least one of said first plurality of terminals, said test unit comparing the measured voltages with reference values;

said test unit detecting correct placement of said second plurality of terminals in response to said comparing of the measured voltages with the reference values;

said test unit detecting integrity of a plurality of electrical connections between said second plurality of terminals and the printed circuit board in response to said comparing of the measured voltages with the reference values;

said test unit including a second connector unit, said test unit being connected to said first connector unit when said second connector unit is coupled with said first connector unit;

a measuring unit being detachably connected to the printed circuit board;

a plurality of circuit components being mounted on the printed circuit board; and said measuring unit applying test signals to at least one of the plurality of circuit components of the printed circuit board, measuring response signals in response to said test signals, storing data corresponding to said response signals.

14. The apparatus of claim 13, said first connector unit further comprising:

a body having a first side and a second side, the first side having a connection slot receiving said second connector unit; and said second plurality of terminals passing through the second side of said body, connecting said first connector unit to the printed circuit board, and detachably connecting said first connector unit to said second connector unit.

15. The apparatus of claim 14, said test unit further comprising:

a test connector unit having said first plurality of terminals detachably connected to said second plurality of terminals of said first connector unit, said test connector unit performing said measuring of the voltages; and a cable electrically connecting said test connector unit with said second connector unit, conveying said verification signal to said at least one of said second plurality of terminals of said first connector unit.

16. The apparatus of claim 15, said first plurality of terminals of said test connector unit further comprising:

a reference terminal; and a plurality of electrical connections each being connected to said reference terminal and each being coupled to one respective electrical element selected from a plurality of electrical elements.

17. The apparatus of claim 16, said plurality of electrical elements corresponding to a plurality of diodes.

18. The apparatus of claim 15, said first plurality of terminals of said test connector unit further comprising:

a reference terminal; and a plurality of electrical connections each being connected to said reference terminal and each being coupled to one respective electrical element selected from a plurality of electrical elements, said plurality of electrical elements corresponding to a plurality of diodes.

19. The apparatus of claim 18, further comprising:

a video display unit conveying varying visual information, said display unit being selected from the group consisting of a liquid crystal display, a cathode ray tube, a field emission display, a plurality of electroluminescent panels, a gas-plasma screen, and a plurality of light-emitting diode panels.

20. The apparatus of claim 13, further comprising:

said measuring unit having a third plurality of terminals;

the printed circuit board having a fourth plurality of terminals coupled to the plurality of circuit components;

said third plurality of terminals of said measuring unit being detachably connected to the fourth plurality of terminals of the printed circuit board; and said measuring unit applying said test signals to the fourth plurality of terminals through said third plurality of terminals.

21. The apparatus of claim 13, said test unit further comprising:

a test connector unit having said first plurality of terminals detachably connected to said second plurality of terminals of said first connector unit, said test connector unit performing said measuring of the voltages; and a cable electrically connecting said test connector unit with said first connector unit, conveying said verification signal to said at least one of said second plurality of terminals of said first connector unit.

22. The apparatus of claim 13, said test unit further comprising:

a test connector unit bearing said first plurality of terminals of said test unit;

said first plurality of terminals including a reference terminal; and said first plurality of terminals further including a plurality of electrical connections each being connected to said reference terminal and each being coupled to one respective electrical element selected from a plurality of electrical elements.

23. The apparatus of claim 22, said plurality of electrical elements corresponding to a plurality of diodes.

24. A method of testing a printed circuit board, comprising:

connecting electrically a first plurality of terminals of a test unit with a second plurality of terminals of a first connector unit;

transmitting a verification signal from said test unit to at least one of said second plurality of terminals of said first connector unit, measuring voltages at at least one of said first plurality of terminals, comparing the measured voltages with reference values;

detecting correct placement of said second plurality of terminals in response to said comparing of the measured voltages with the reference values; and detecting integrity of a plurality of electrical connections between said second plurality of terminals and the printed circuit board in response to said comparing of the measured voltages with the reference values.

25. The method of claim 24, further comprising:

connecting a measuring unit to the printed circuit board, the printed circuit board having a plurality of circuit components mounted thereon; and applying test signals to at least one of the plurality of circuit components of the printed circuit board, measuring response signals in response to said test signals, identifying defects in the plurality of circuit components according to said response signals, identifying defects in connections among the plurality of circuit components according to said response signals, storing data corresponding to said response signals.

26. The method of claim 25, further comprising:

connecting a third plurality of terminals of said measuring unit to a fourth plurality of terminals of the printed circuit board, the fourth plurality of terminals being coupled to the plurality of circuit components; and applying said test signals to the fourth plurality of terminals from said measuring unit through said third plurality of terminals.

* * * * *